US006135236A

United States Patent [19]

Ravnaas

[11] Patent Number: 6,135,236
[45] Date of Patent: Oct. 24, 2000

[54] MOUNTING PLATE FOR LOUDSPEAKERS

[75] Inventor: Brian Eric Ravnaas, 715 Broadway #8, Fargo, N. Dak. 58102

[73] Assignee: Brian Eric Ravnaas, Fargo, N. Dak.

[21] Appl. No.: 09/374,903

[22] Filed: Aug. 13, 1999

[51] Int. Cl.[7] ........................ H05K 5/00
[52] U.S. Cl. ........................ 181/151; 181/199
[58] Field of Search ........................ 181/148, 150, 181/151, 156, 199, 141

[56] References Cited

U.S. PATENT DOCUMENTS 5,241,512 8/1993 Argy .
5,949,033 9/1999 Anagnos ........................ 181/148

*Primary Examiner*—Khanh Dang

[57] ABSTRACT

A loudspeaker mounting plate having metal rods embedded in a body in such a way that both rigidity and internal damping are maximized. A circular hole is included to allow for the mounting of a loudspeaker. Two sets of metal rods are utilized, the first being placed partially under the loudspeakers frame for maximum surface hardness, and the second being used for bracing the width of the plate. The use of two materials with different properties results in a structure that is highly resistant to vibration.

8 Claims, 4 Drawing Sheets

MOUNTING PLATE FOR LOUDSPEAKERS

CROSS-REFERENCE TO RELATED APPLICATIONS

Not applicable.

BACKGROUND

1. Field of Invention

This invention relates to loudspeakers, specifically to a device for mounting loudspeakers.

2. Description of Prior Art

The loudspeaker industry utilizes many different materials to mount loudspeakers. The purpose of these materials is to give the loudspeaker a rigid, resonance-free surface against which to exert the forces it generates while reproducing sound.

The most common material used for loudspeaker mounting is wood. The primary advantage of wood is low cost. It is also extremely easy to work with. However, it has several major downfalls. Wood has relatively poor hardness and rigidity. This makes it quite prone to flexing, compression, and vibration at low frequencies under the pressures exerted by loudspeakers during playback. It also has poor internal damping, or ability to dissipate internal energy, which results in its resonance modes being long in duration.

Various types of metal have also been employed for loudspeaker mounting. The biggest advantage for using metal is its excellent rigidity and hardness. However, metal is expensive and very difficult to work with. This raises its cost even further. Metal also has poor internal damping, giving it a tendency to ring when an internal resonance mode is stimulated. These resonance modes tend to be higher in frequency than those of softer materials.

Concrete is another material that occasionally gets used for the mounting of loudspeakers. It is inexpensive and falls between wood and metals for rigidity and hardness. Concrete also shows relatively good internal damping. However, it also has disadvantages. One is that it requires precise molding. The cost of the molds and the time that it takes to produce parts from them negates the advantage of low cost. Like metals, concrete is far more difficult to drill and machine than wood.

Various forms of polymer resins are also used for loudspeaker mounting. The cost of these materials is higher than wood or concrete, but lower than machined metal. The hardness and rigidity of these materials fall between that of metal and concrete. Workability of these materials ranges from nearly as easy as wood, to even more difficult than concrete. The drawback of the easily manipulated polymers is that they are also the softest, and least rigid of such materials. Like concrete, most polymers have good internal damping.

SUMMARY

In accordance with the present invention a loudspeaker mounting plate comprises metal pieces embedded in a polymer resin plate.

OBJECTS AND ADVANTAGES

The plate overcomes the above mentioned problems in several ways. The largest advantage results from the interaction of two materials with different properties. At low frequencies the rigidity of the embedded metal prevents the flexing that could occur in polymer alone, while at high frequencies the polymer damps any resonance that could occur in metal alone. Thus, the plate is highly resistant to vibration across the entire frequency band. Secondly, the inclusion of metal pieces, both directly under the loudspeaker and extending across the width of the structure, results in both surface hardness and flexural rigidity exceeding that of polymer, wood, or concrete. Further, the cost of this plate is far lower than machined metal as commonly available metal shapes are utilized. Its user can also easily drill the plate for loudspeaker installation, due to the metal being placed away from critical drilling locations.

DRAWING FIGURES

In the drawings, closely related figures have the same number but different alphabetic suffixes.

REFERENCE NUMBERALS IN DRAWINGS

| |
|---|
| 10 polymer resin plate |
| 12 driver mounting rod |
| 14 bracing rod |
| 16 driver mounting hole |
| 18 dual purpose rod |
| 20 loudspeaker |
| 22 enclosure |

Figure 1:
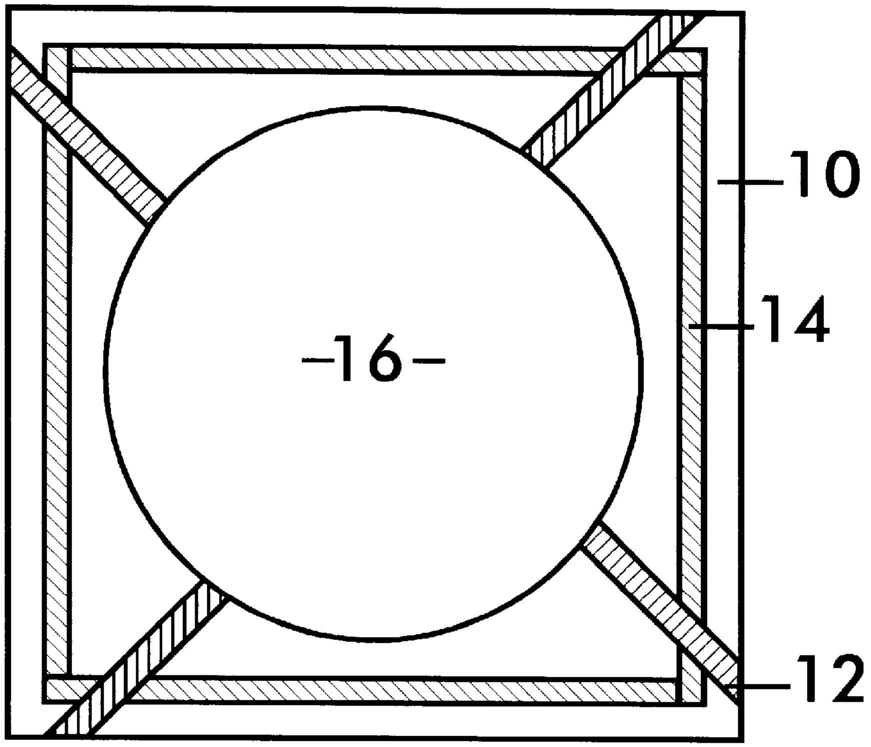
FIG. 1 shows a top view of a preferred embodiment of this plate.
Figure 2:
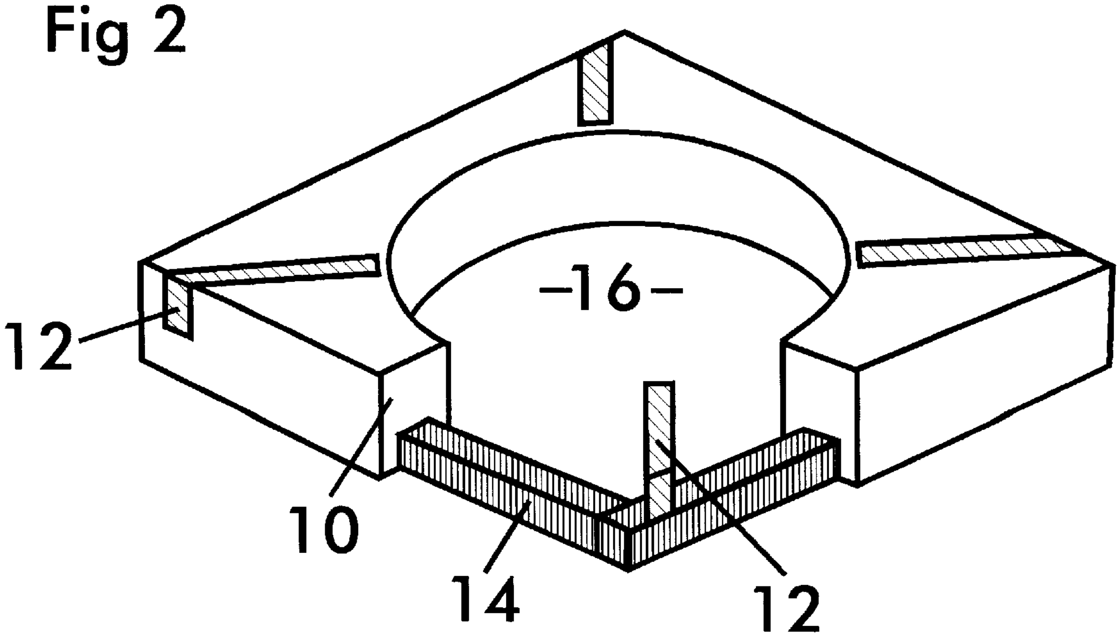
FIG. 2 shows the preferred embodiment in perspective with a portion of the plates body pulled away to reveal the metal structure.

DESCRIPTION—FIGS. 1 and 2—Preferred Embodiment

A preferred embodiment of the mounting plate of the present invention is illustrated in FIGS. 1 and 2. The plate consists of a square, polymer resin plate (10) with a circular driver mounting hole (16) at its center to facilitate the mounting of a loudspeaker. Embedded in the plate (10) are two sets of square metal rods. A set of driver mounting rods (12) extend from the driver mounting hole to the comer of the plate. These are positioned slightly off center, so that they do not lie on a line diagonally bisecting the plate. A set of bracing rods (14) are long metal rods extending nearly the width of the plate and placed just below the driver mounting rods. The preferred resin is a mineral filled polyurethane elastomer. Steel is the preferred metal.

The thickness of the plate (10) is typically 25 mm to 40 mm. rods are typically 10 mm to 25 mm thick. The other dimensions of the plate (10) and the dimensions of the driver mounting hole (16) vary with the size of loudspeaker that is to be used.

Additional Embodiments

Figure 3:
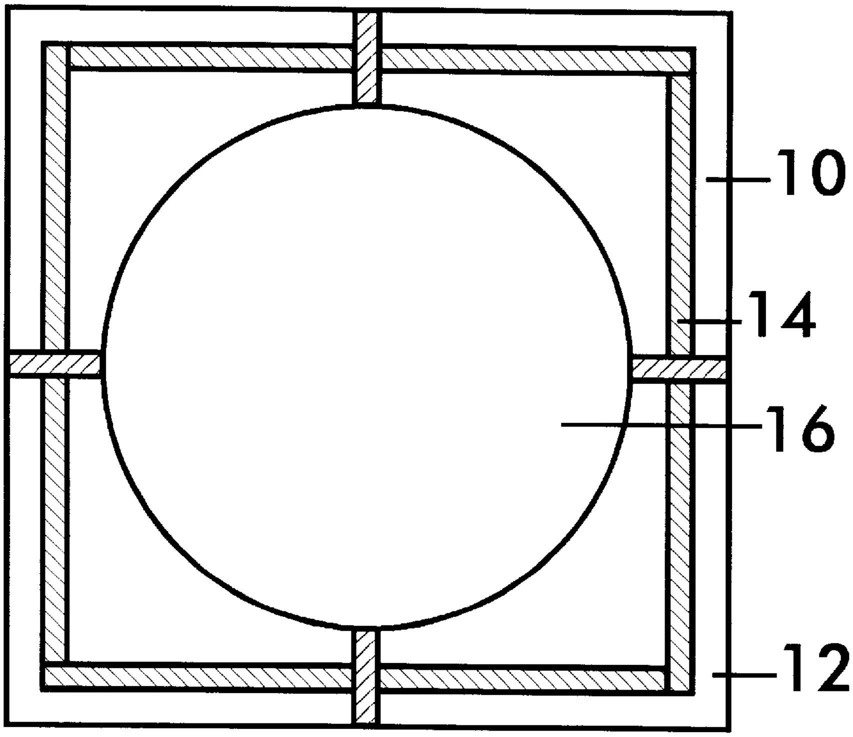
FIG. 3 shows an alternate metal pattern in which the driver mounting rods are short pieces placed in the center of the plates edges.
Figure 4:
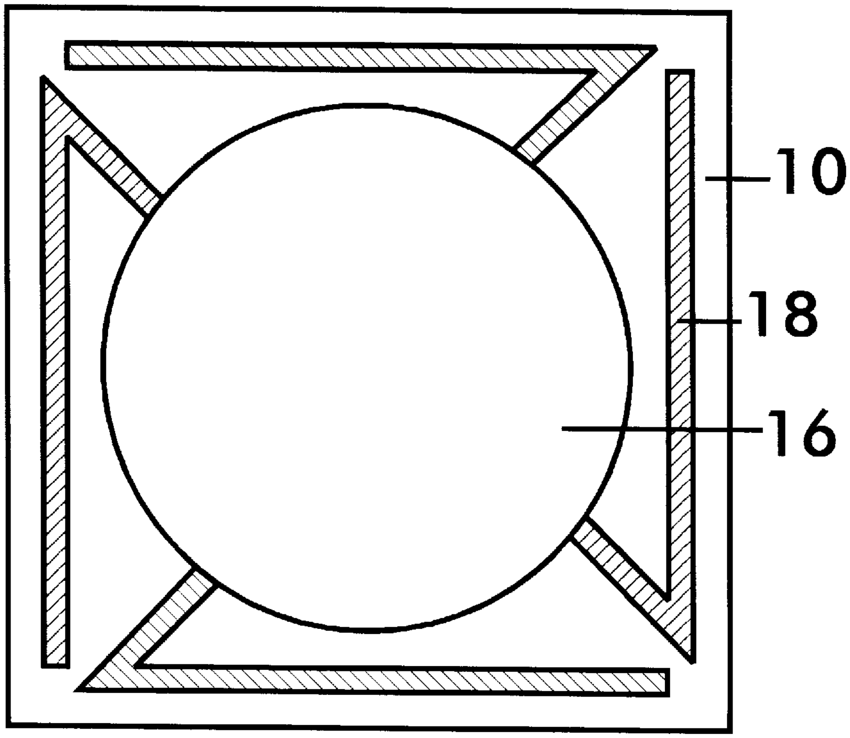
FIG. 4 shows an alternate steel pattern in which single set of metal rods are used for both driver mounting and bracing purposes.
Figure 5:
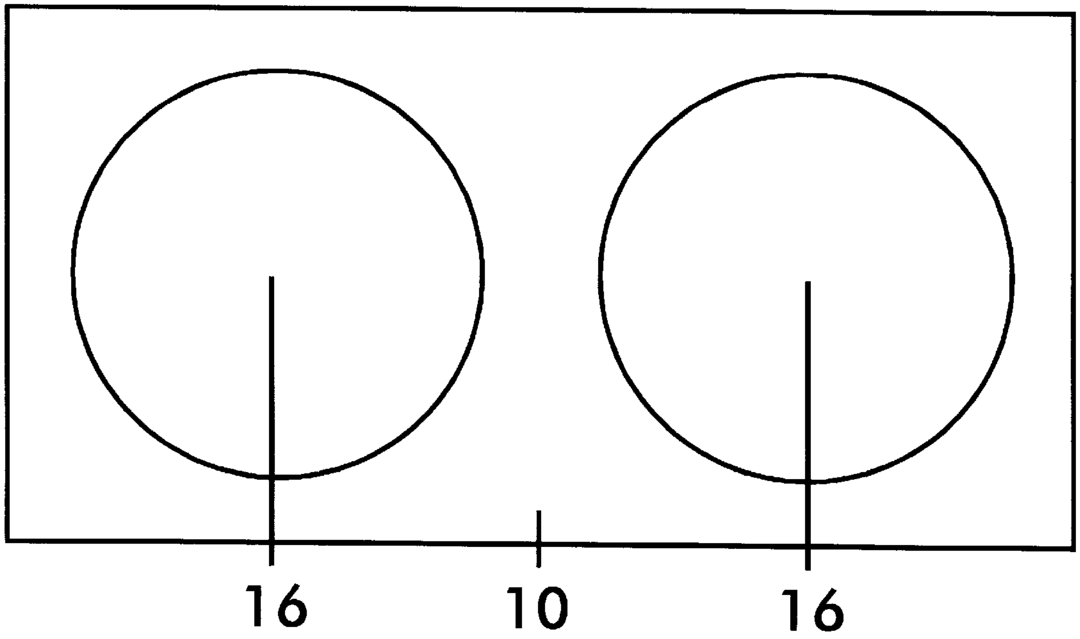
FIG. 5 shows a plate for the mounting of multiple drivers no metal pattern is shown as an equally wide variety of options are available.
Figure 6:
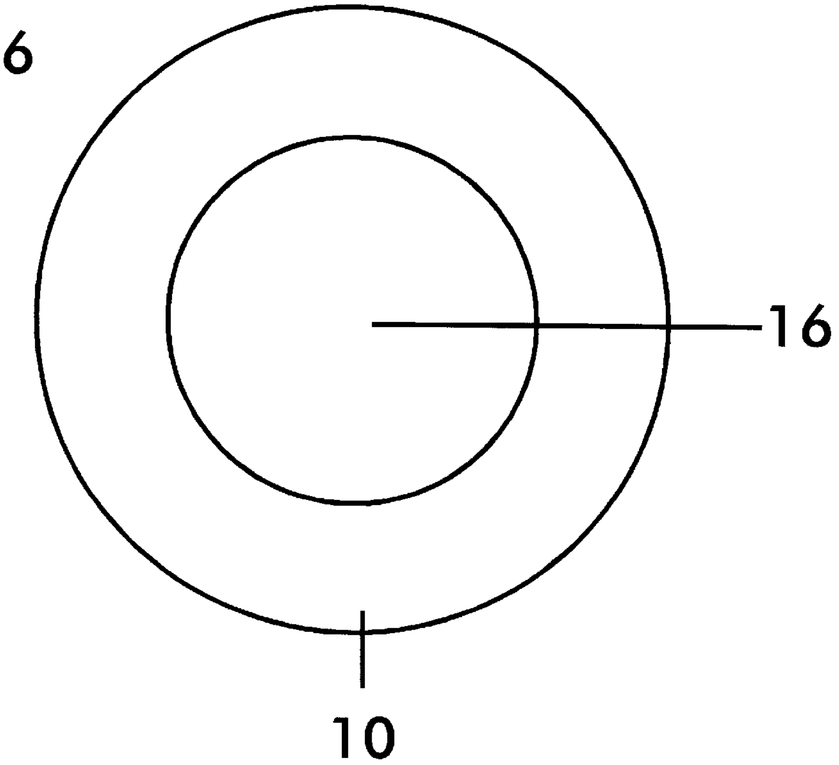
FIG. 6 shows a plate that is circular in shape, again no metal pattern is shown.

Many other embodiments could be constructed. These include a nearly limitless variety of metal patterns. FIG. 3 shows a pattern with the driver mounting rods (12) placed in the center of the plate's edge. FIG. 4 shows a simple pattern using a single dual purpose rod (18) to replace both the driver mounting rods (12) and the bracing rods (14). Plates for the mounting of multiple loudspeakers are another possibility. FIG. 5 shows a surface view of a rectangular plate (10) for mounting two loudspeakers. The polymer plate could also take a wide assortment of shapes. FIG. 6 shows a circular plate. Metal patterns have not been shown in FIGS. 5 and 6 as there are as many possible patterns as exist for rectangular, single driver plates. A wide variety of other polymers such as polyester, acrylics, epoxy, vinyl ester, ABS, etc. could be utilized, and with a wide variety of filler materials and sizes. Concrete, fiberglass, wood or any other material that would allow for embedded metal could also be substituted. Additionally, many different metals, such as zinc, aluminum, magnesium, beryllium, or various alloys, could replace the steel used in the preferred embodiment. The thickness of the plate and metal pieces, as well as the overall dimensions, could also be varied.

Figure 7:
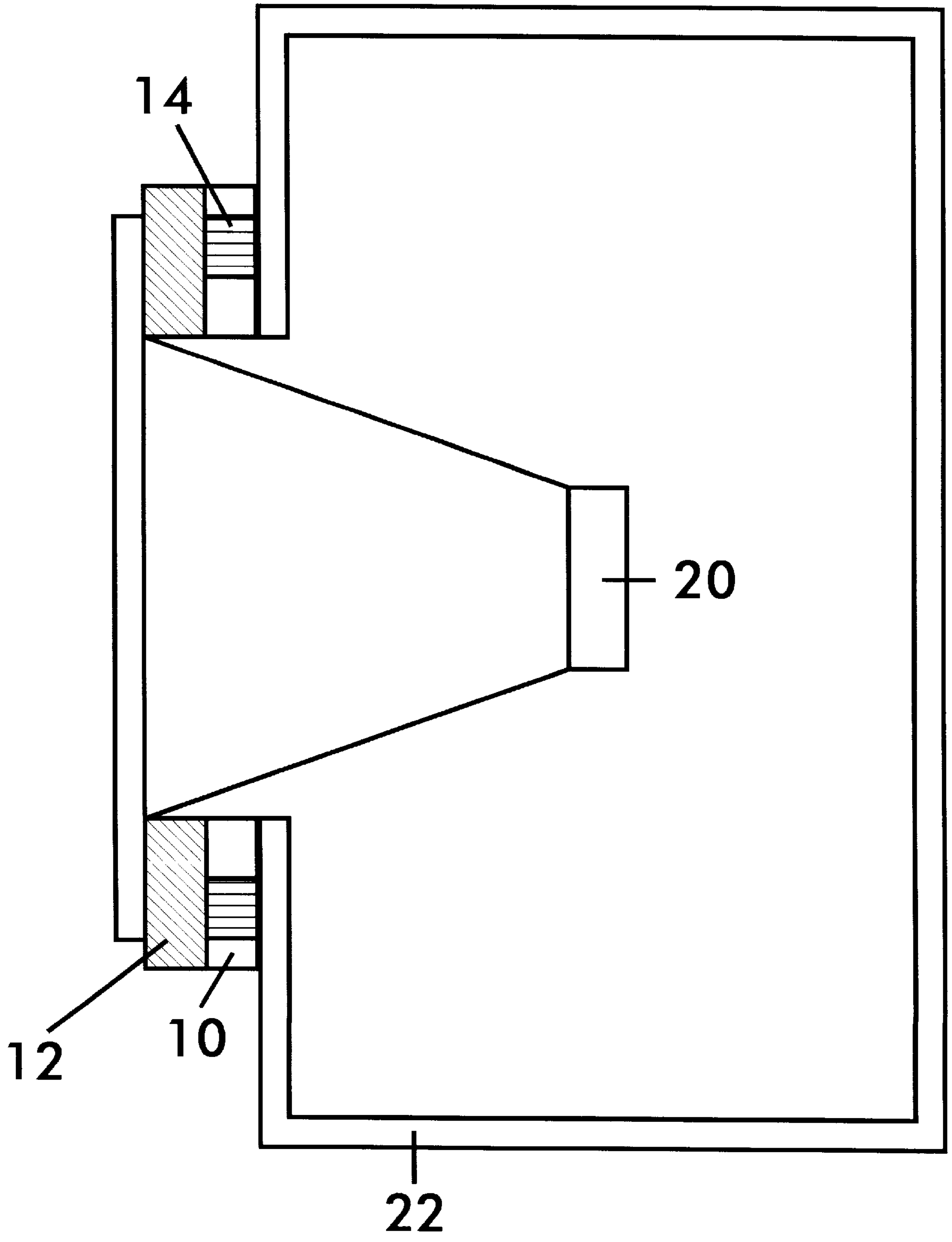
FIG. 7 shows a loudspeaker mounted on a plate, and installed in its enclosure.

Operation—FIG. 7

The manner of using the metal embedded loudspeaker plate is identical to using any other mounting baffle. The loudspeaker (20) is placed in the driver mounting hole (16) and fastened to the mounting plate using screws or whatever other form of fastening is desired. The drilling of pilot holes will ease the entrance of the screw into the polymer plate (10). This plate/loudspeaker structure is then mounted on a hole in the enclosure (22) in the same manner that a conventional driver would be. FIG. 7 shows a woofer installed on a mounting plate in its enclosure.

The loudspeaker then has an exceptionally rigid and well-damped surface against which to exert the forces necessary for sound reproduction.

Conclusion, Ramification, and Scope

Accordingly, the reader will see that the metal embedded loudspeaker mounting plate of this invention offers a nearly ideal mounting surface for loudspeakers. It combines superb hardness and rigidity along with a high degree of internal damping while retaining low costs and workability. Additionally the shape and size of the plate have additional advantages in that

- it can be easily integrated into existing loudspeaker cabinets, eliminating the need to waste previous investments in enclosure construction in order to utilize a high performance mounting surface;
- it can be finished to the users liking including paints, gel coats, wood veneers, etc.;

Although the description above contains much specificity, these should not be construed as limiting the scope of the invention but as merely providing illustrations of some of the presently preferred embodiments of this invention. For example, the plate can be constructed with a variety of metal patterns, geometric shapes, polymers, and metals. Plates for the mounting of multiple loudspeakers are also possible.

Thus the scope of the invention should be determined by the appended claims and their legal equivalents, rather than by the examples given.

I claim:

1. A plate for mounting a loudspeaker comprising a body of material, a plurality of metal rods wherein said metal rods are embedded in said body of material, and said body of material includes a hole for mounting said loudspeaker.

2. The plate of claim 1 wherein said body of material is composed of a polymer resin.

3. The plate of claim 2 wherein said polymer resin is a mineral filled polyurethane.

4. The plate of claim 1 wherein said metal rods are rectangular rods.

5. The plate of claim 4 wherein a portion of said metal rods are laid partially adjacent to said hole.

6. The plate of claim 4 wherein said metal rods are comprised of steel.

7. The plate of claim 1 wherein said body of material has multiple holes for mounting multiple loudspeakers.

8. The plate of claim 1 wherein said body of material is rectangular in shape.

* * * * *